(12) United States Patent
Hoshi

(10) Patent No.: US 11,189,723 B2
(45) Date of Patent: Nov. 30, 2021

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/081,607

(22) Filed: Oct. 27, 2020

(65) Prior Publication Data

US 2021/0175353 A1 Jun. 10, 2021

(30) Foreign Application Priority Data

Dec. 10, 2019 (JP) .............................. JP2019-223280

(51) Int. Cl.
| | |
|---|---|
| *H01L 29/78* | (2006.01) |
| *H01L 29/66* | (2006.01) |
| *H01L 29/423* | (2006.01) |
| *H01L 29/16* | (2006.01) |

(52) U.S. Cl.
CPC ...... *H01L 29/7813* (2013.01); *H01L 29/1608* (2013.01); *H01L 29/4236* (2013.01); *H01L 29/66734* (2013.01)

(58) Field of Classification Search
CPC ............. H01L 29/7813; H01L 29/1608; H01L 29/4236; H01L 29/66734
USPC ....................................................... 257/77
See application file for complete search history.

(56) References Cited

U.S. PATENT DOCUMENTS

| | | | |
|---|---|---|---|
| 2007/0194350 A1 | 8/2007 | Hirooka et al. | |
| 2009/0072300 A1 | 3/2009 | Yamamoto et al. | |
| 2015/0357415 A1* | 12/2015 | Kagawa | H01L 29/0623 257/77 |
| 2017/0141223 A1* | 5/2017 | Hoshi | H01L 29/7813 |
| 2017/0256536 A1* | 9/2017 | Nishida | H01L 29/7397 |
| 2017/0301788 A1* | 10/2017 | Fukui | H01L 29/0661 |

(Continued)

FOREIGN PATENT DOCUMENTS

| | | |
|---|---|---|
| JP | 2003-332577 A | 11/2003 |
| JP | 2007-081229 A | 3/2007 |

(Continued)

*Primary Examiner* — Igwe U Anya
(74) *Attorney, Agent, or Firm* — Rabin & Berdo, P.C.

(57) ABSTRACT

A semiconductor device including a semiconductor substrate, a first semiconductor layer provided on a main surface of the semiconductor substrate, a second semiconductor layer selectively provided on a surface of the first semiconductor layer, a plurality of first and second semiconductor regions selectively provided in the second semiconductor layer at a surface thereof, and a plurality of trenches provided in a striped pattern that extends in a first direction. The first semiconductor regions include a plurality of connecting parts and a plurality of non-connecting parts that are alternately arranged in the first direction, each connecting part being continuous in a second direction orthogonal to the first direction, and each non-connecting part being separated into two halves in the second direction by one of the second semiconductor regions, each half including a plurality of regions having different resistance values, disposed in a descending order or an ascending order of the resistance values along the first direction.

5 Claims, 12 Drawing Sheets

(56) References Cited

U.S. PATENT DOCUMENTS

| | | | | |
|---|---|---|---|---|
| 2017/0365709 A1* | 12/2017 | Ohashi | ................ | H01L 29/086 |
| 2018/0350976 A1* | 12/2018 | Okumura | ............ | H01L 29/1079 |
| 2020/0152748 A1* | 5/2020 | Okumura | ............ | H01L 29/7803 |
| 2020/0203482 A1* | 6/2020 | Kaji | ................ | H01L 29/66068 |

FOREIGN PATENT DOCUMENTS

| JP | 2009-076540 A | 4/2009 |
|---|---|---|
| JP | 2015-170818 A | 9/2015 |
| JP | 2019-046909 A | 3/2019 |

* cited by examiner

FIG.1
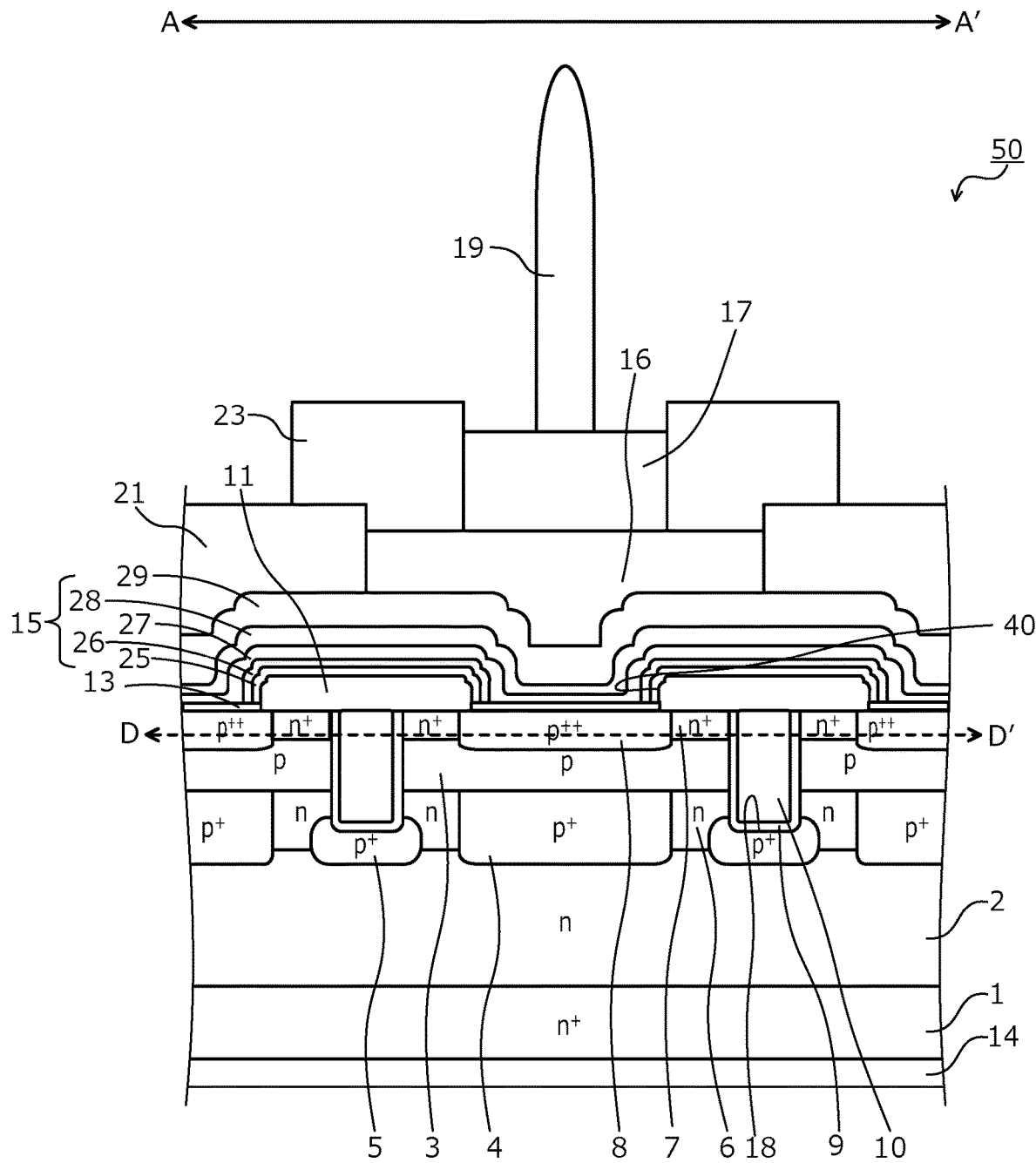
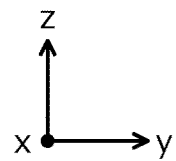

FIG.4
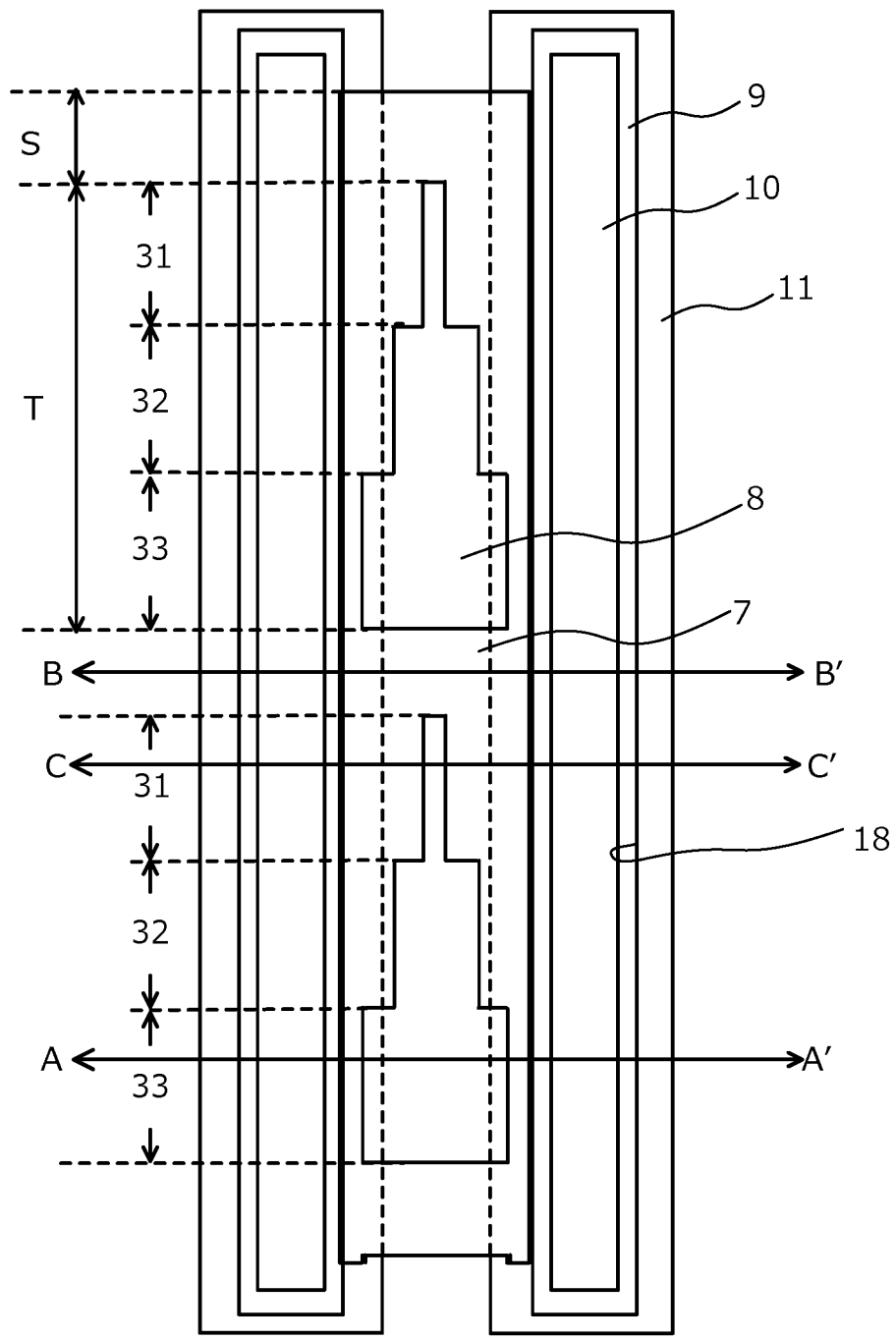
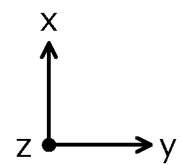

SEMICONDUCTOR DEVICE

CROSS REFERENCE TO RELATED APPLICATIONS

This application is based upon and claims the benefit of priority of the prior Japanese Patent Application No. 2019-223280, filed on Dec. 10, 2019, the entire contents of which are incorporated herein by reference.

BACKGROUND OF THE INVENTION

1. Field of the Invention

Embodiment of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon, such as, for example, gallium nitride (GaN). Therefore, use of a wide bandgap semiconductor enables high withstand voltage for semiconductor devices.

A trench gate structure is a MOS gate structure in which a MOS gate is embedded in a trench formed at a front surface of a semiconductor substrate (semiconductor chip) and a channel (inversion layer) is formed in a direction orthogonal to the front surface of the semiconductor substrate, along sidewalls of the trench. Therefore, compared to a planar-type structure in which a channel is formed along the front surface of the semiconductor substrate, unit cell (constituent unit of an element) density per unit area may be increased and current density per unit area may be increased, which is advantageous in terms of cost. A planar-type structure is a MOS gate structure in which a MOS gate is provided in a flat shape on the front surface of the semiconductor substrate.

Further, a rate of temperature rise relative to a volume occupied by the unit cells increases by an extent to which device current density is increased and therefore, to enhance discharge efficiency and stabilize reliability, a double-sided cooling structure is necessary. The double-sided cooling structure is a structure in which heat generated by the semiconductor substrate is dissipated externally from both surfaces of the semiconductor substrate to thereby enhance heat dissipation of the entire semiconductor substrate. By the double-sided cooling structure, the heat generated by the semiconductor substrate is dissipated from a cooling fin that is in contact with a back surface of the semiconductor substrate via a metal base plate, and through a terminal pin having one end bonded to the front surface of the semiconductor substrate, the heat is dissipated from a metal bar bonded to the other end of the terminal pin.

Further, to enhance reliability, a device has been proposed in which on a single semiconductor substrate with a vertical MOSFET that is a main semiconductor element, a high-function structure is necessary in which high-function regions such as a current sensing region, a temperature sensing region, and an over-voltage protecting region are disposed. In a case of the high-function structure, to stably form the high-function regions, in an active region, a region in which only high-function regions are disposed is provided separate from the unit cells of the main semiconductor element and adjacent to an edge termination region. The active region is a region through which a main current flows when the main semiconductor element is ON. The edge termination region is a region for mitigating electric field at a front side of the semiconductor substrate and sustaining a breakdown voltage (withstand voltage). The breakdown voltage is a voltage limit at which no erroneous operation or destruction occurs.

A structure of a conventional silicon carbide semiconductor device will be described taking a trench-type MOSFET as an example. FIG. 13 is a cross-sectional view of the structure of the conventional silicon carbide semiconductor device. As depicted in FIG. 13, in a trench-type MOSFET 150, an n-type silicon carbide epitaxial layer 102 is deposited on a front surface of an $n^+$-type silicon carbide substrate 10. At a surface of the n-type silicon carbide epitaxial layer 102, opposite another surface thereof facing the $n^+$-type silicon carbide substrate 101, n-type high-concentration regions 106 are provided. Further, in a surface layer of the n-type high-concentration regions 106, on a side of the n-type high-concentration regions 106 opposite another side thereof facing the $n^+$-type silicon carbide substrate 101, first $p^+$-type base regions 104 are selectively provided. In the n-type high-concentration regions 106, second $p^+$-type base regions 105 are selectively provided so as to respectively underlie bottoms of trenches 118 entirely.

Further, in the conventional trench-type MOSFET 150, a p-type silicon carbide epitaxial layer 103, $n^+$-type source regions 107, $p^{++}$-type contact regions 108, a gate insulating film 109, gate electrodes 110, an interlayer insulating film 111, source electrodes 113, a back electrode 114, the trenches 118, a source electrode pad 115, and a drain electrode pad (not depicted) are provided.

The source electrodes 113 are provided on the $n^+$-type source regions 107 and the $p^{++}$-type contact regions 108, and the source electrode pad 115 is provided on the source electrodes 113. The source electrode pad 115 is a multilayer film in which a first TiN film 125, a first Ti film 126, a second TiN film 127, a second Ti film 128, and an Al alloy film 129 are sequentially stacked. Further, a plating film 116, solder 117, external electrode pins 119, a first protective film 121, and a second protective film 123 are provided on top of the source electrode pad 115.

FIG. 14 is a plan view of the structure of the conventional silicon carbide semiconductor device. FIG. 14 depicts a plan view of a part along cutting line D-D' in FIG. 13, as viewed from a lower side. As depicted in FIG. 14, the $n^+$-type source regions 107 are provided in a lattice pattern and the $p^{++}$-type contact regions 108 are provided separate from the gate insulating film 109. In other words, in the active region where the MOS structure is formed, tops of linear parts T' of each of the $n^+$-type source regions 107 provided near the gate insulating film 109 are covered by the interlayer insulating film 111 and are not in contact with the source electrodes 113. On the other hand, at connecting parts S' of each of the $n^+$-type source regions 107, the interlayer insulating film 111 has an opening, whereby the source electrodes 113 and the $n^+$-type source regions 107 are in contact with one another. In this manner, one pitch surrounding each if the $n^+$-type source regions 107 is formed continuously.

Further, a planar type vertical MOS field effect transistor is commonly known in which shape of a P-type high-concentration body contact surface is circular or rhomboidal, thereby enabling reduction of ON resistance (for example, refer to Japanese Laid-Open Patent Publication No. 2007-081229).

Further, a MOSFET is commonly known in which n-type source regions of two different widths are provided alternating one another (for example, refer to Japanese Laid-Open Patent Publication No. 2009-076540).

SUMMARY OF THE INVENTION

According to an embodiment of the invention, a semiconductor device includes a semiconductor substrate of a first conductivity type, having a first main surface and a second main surface opposite to each other; a first semiconductor layer of the first conductivity type, provided on the first main surface of the semiconductor substrate and having an impurity concentration lower than an impurity concentration of the semiconductor substrate, the first semiconductor layer having a first surface and a second surface opposite to each other, the second surface facing the semiconductor substrate; a second semiconductor layer of a second conductivity type, selectively provided on the first surface of the first semiconductor layer, the second semiconductor layer having a first surface and a second surface opposite to each other, the second surface facing the semiconductor substrate; a plurality of first semiconductor regions of the first conductivity type, selectively provided in the second semiconductor layer at the first surface thereof; a plurality of second semiconductor regions of the second conductivity type, selectively provided in the second semiconductor layer at the first surface thereof, to be in contact with the first semiconductor regions; a plurality of trenches provided in a striped pattern that extends in a first direction, penetrating the first semiconductor regions and the second semiconductor layer, and reaching the first semiconductor layer; a plurality of gate electrodes respectively provided in the trenches via a gate insulating film; a plurality of first electrodes provided on surfaces of the first semiconductor regions and the second semiconductor regions; and a second electrode provided on the second main surface of the semiconductor substrate. The first semiconductor regions include a plurality of connecting parts and a plurality of non-connecting parts that are alternately arranged in the first direction, each connecting part being continuous in a second direction orthogonal to the first direction, and each non-connecting part being separated into two halves in the second direction by one of the second semiconductor regions, each half including a plurality of regions having different resistance values, disposed in a descending order or an ascending order of the resistance values along the first direction. The first electrodes are in contact with the first semiconductor regions through the connecting parts of the first semiconductor regions.

In the embodiment, in said each half, the plurality of regions have a plurality of widths in the second direction, the widths changing stepwise along the first direction.

In the embodiment, in said each half, the plurality of regions include three regions, which are a high-resistance region, an intermediate-resistance region, and a low-resistance region that are disposed sequentially.

In the embodiment, one of the non-connecting parts is separated by one of the second semiconductor regions that is of a diamond-shape, a diagonal of which connects midpoints of the one non-connecting part in a plan view.

In the embodiment, the plurality of regions having the different resistance values are periodically disposed along the first direction.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a cross-sectional view along cutting line A-A' in FIG. 4, depicting a structure of the silicon carbide semiconductor device according to the embodiment.

FIG. 4 is a plan view of the structure of the silicon carbide semiconductor device according to the embodiment.

DETAILED DESCRIPTION OF THE INVENTION

First, problems associated with the conventional techniques will be discussed. In the MOSFET, voltage is applied to the gate electrodes 110, whereby current flows between a drain electrode (back electrode) 114 and the source electrodes 113. During rated-voltage operation, voltage of a few volts is applied to the gate electrodes 110, current flows between the drain electrode 114 and the source electrodes 113, and the rated voltage is applied.

Here, an element or load of an inverter may short circuit and while the gate is ON, high voltage, for example, high voltage of at least 20V may be applied to the gate electrodes 110. In this case, high voltage at least equal to the rated voltage is applied between the drain electrode 114 and the source electrodes 113. Therefore, in instances in which the silicon carbide semiconductor device is used as an inverter, an over-voltage protecting region, etc. is provided in the high-function region and when high voltage is applied to the gate electrodes 110, the over-voltage protecting region, etc. operate, thereby protecting the silicon carbide semiconductor device from being destroyed.

Nonetheless, there is a time lag of 5 μs to 10 μs until the over-voltage protecting region begins to operate and during this interval, high voltage at least equal to the rated voltage is applied between the drain electrode 114 and the source electrodes 113.

Figure 15:
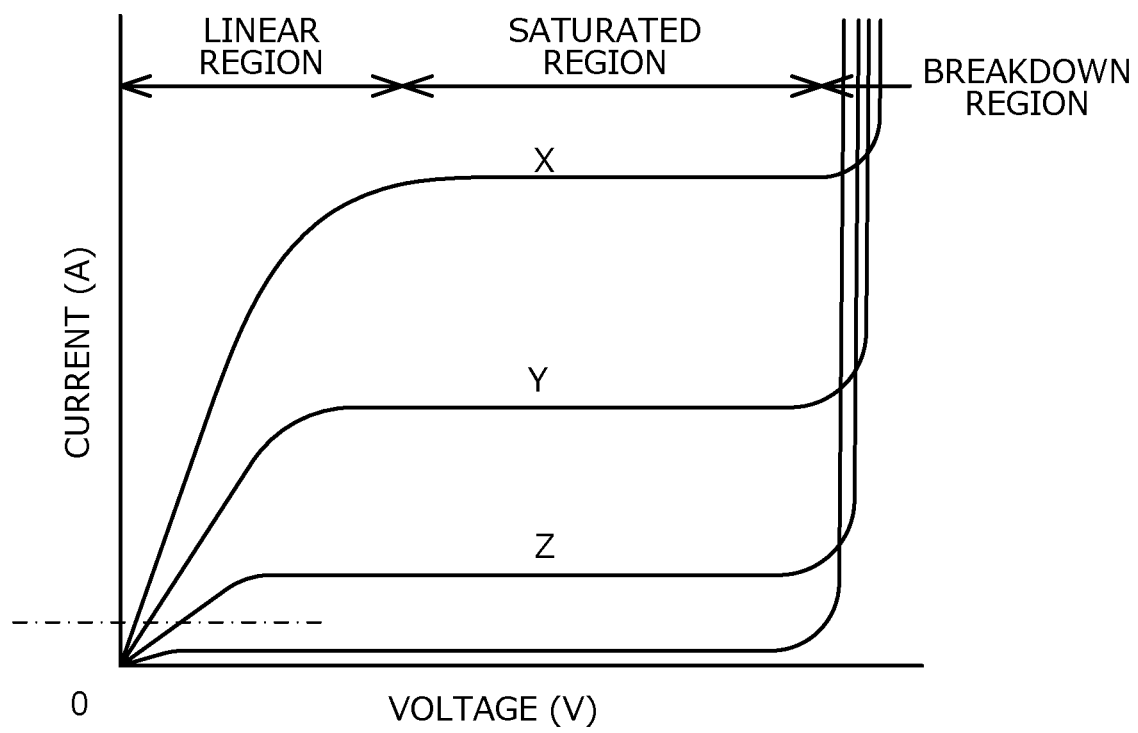
FIG. 15 is a graph depicting characteristics of the conventional silicon carbide semiconductor device.

FIG. 15 is a graph depicting characteristics of the conventional silicon carbide semiconductor device. In FIG. 15, a horizontal axis indicates voltage between the drain and the source in units of V. A vertical axis indicates current between the drain and source in units of A. In FIG. 15, characteristics of silicon carbide semiconductor devices for which ON resistances (RonA) differ are depicted, a curve indicated by X depicts characteristics of a silicon carbide semiconductor device having the lowest RonA, a curve indicated by Y depicts characteristics for the next lowest RonA, and a curve indicated by Z depicts characteristics for the highest RonA. RonA is energization resistance between the source electrodes and the drain electrode in a case of rated current.

As depicted in FIG. 15, during rated-voltage operation (dotted-dashed line in FIG. 15), the lower is RonA, the better is a characteristic of more current flowing between the drain electrode 114 and the source electrodes 113 for the same voltage. Therefore, silicon carbide semiconductor devices having low RonA have been manufactured. On the other hand, in a saturated region, as RonA decreases, saturated current increases and large current flows.

When RonA is low, the saturated current that flows until the over-voltage protecting region, etc. begins to operate is small and destruction of the silicon carbide semiconductor device is rare; however, as RonA increases, the saturated current increases. In when the $n^+$-type source regions 107 have the structure described above, as the cell pitch is reduced, linear density of the cells increases overall and therefore, resistance between the source and the drain decreases, and RonA decreases. RonA decreases with division of the cells and therefore, saturated current of an element increases. As a result, power of the current and the voltage applied to the element increase, the heat generated by the element increases and operation of a parasitic bipolar transistor easily occurs. In this case, the saturated current that flows until the over-voltage protecting region, etc. begins to operate is large and the operation of the over-voltage protecting region, etc. may be too late, whereby the silicon carbide semiconductor device may be destroyed. In this manner, when the cell pitch is reduced to reduce RonA, a problem arises in that short circuit capability of the silicon carbide semiconductor device decreases.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
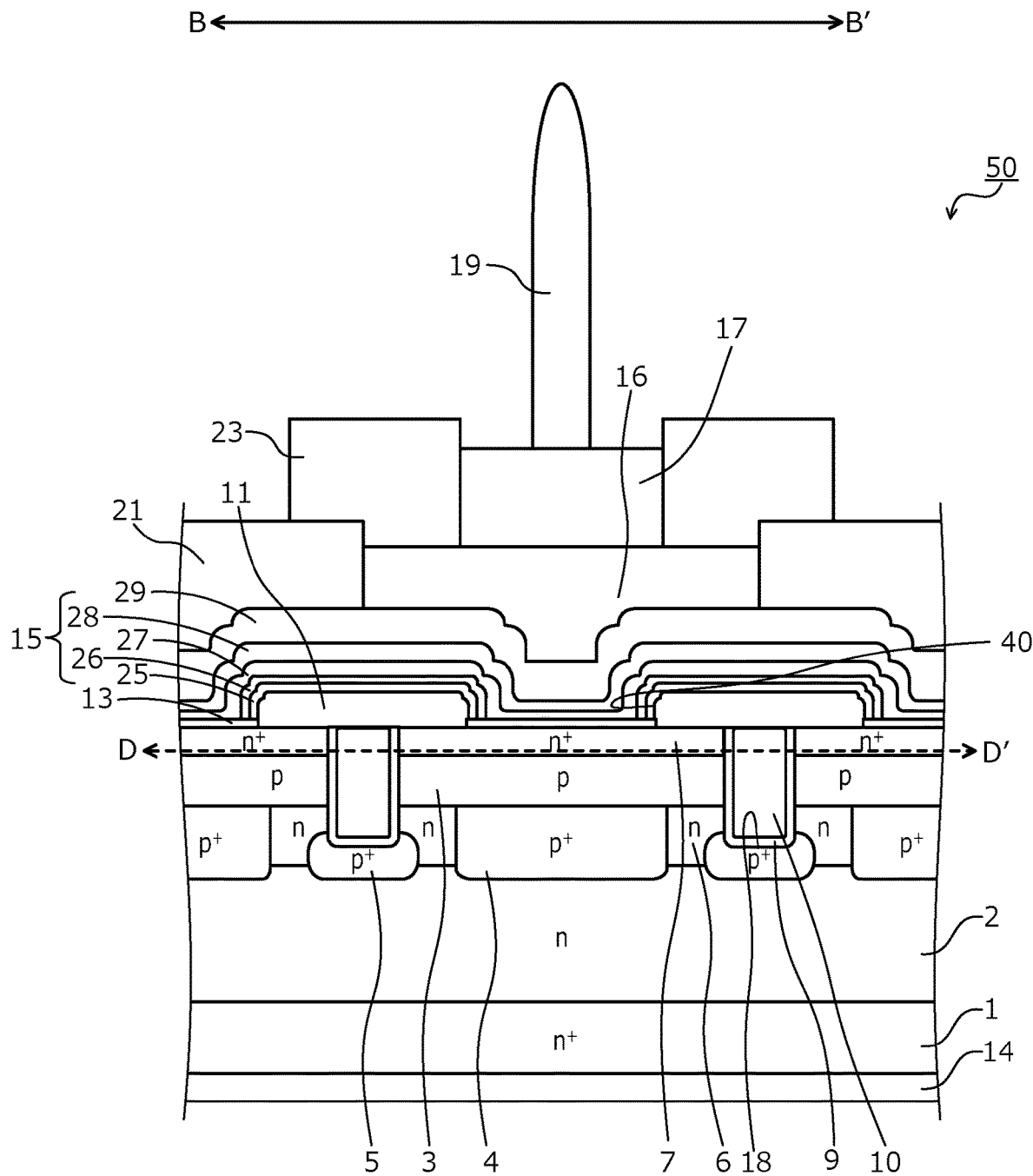
FIG. 2 is a cross-sectional view along cutting line B-B' in FIG. 4, depicting the structure of the silicon carbide semiconductor device according to the embodiment.
Figure 3:
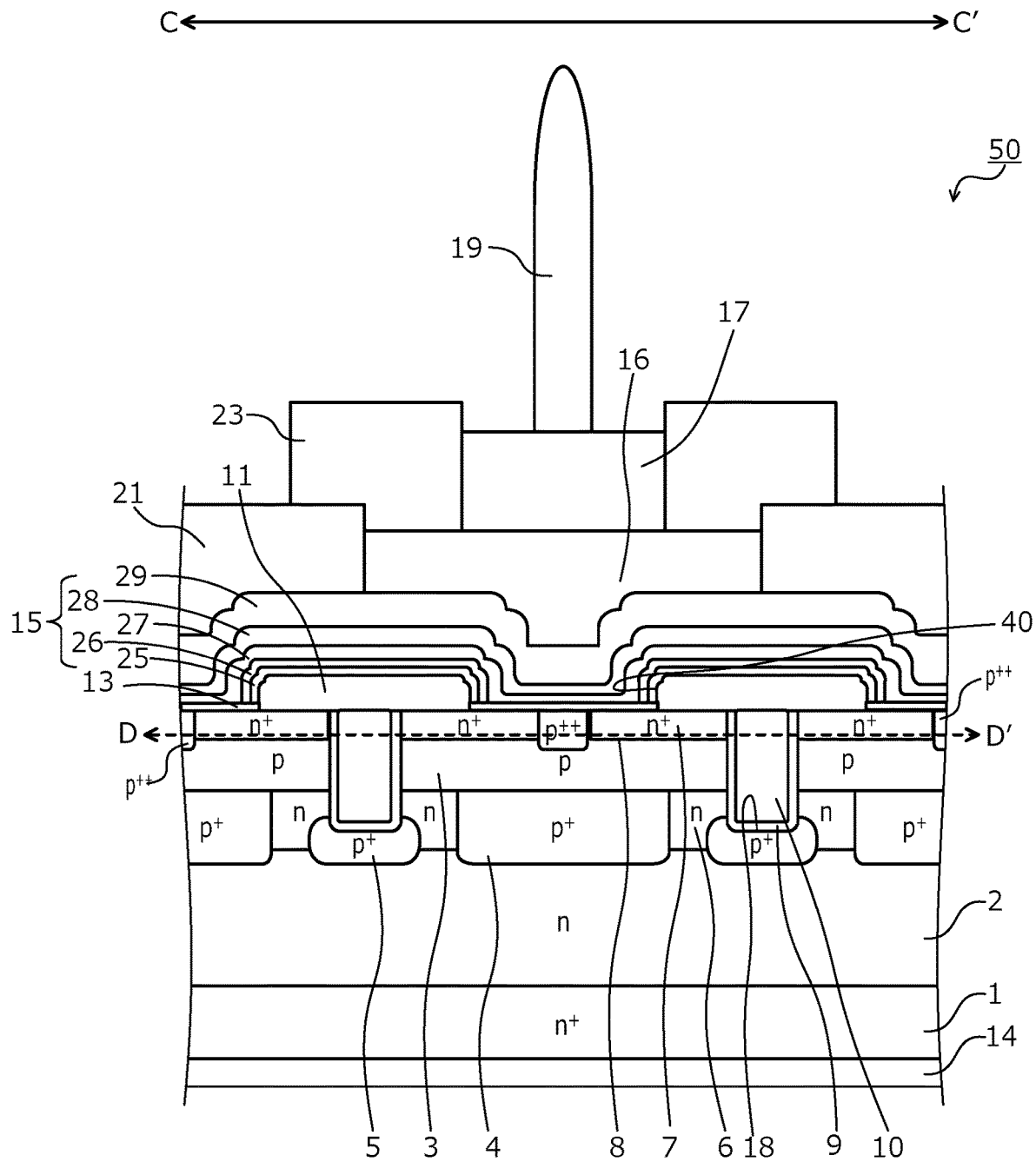
FIG. 3 is a cross-sectional view along cutting line C-C' in FIG. 4, depicting the structure of the silicon carbide semiconductor device according to the embodiment.

A semiconductor device according to an embodiment is formed using a semiconductor (hereinafter, wide bandgap semiconductor) having a bandgap wider than that of silicon (Si). A structure of the semiconductor device according to the embodiment will be described taking, as an example, a case in which, for example, silicon carbide (SiC) is used as the wide bandgap semiconductor. FIG. 1 is a cross-sectional view along cutting line A-A' in FIG. 4, depicting the structure of the silicon carbide semiconductor device according to the embodiment. FIG. 2 is a cross-sectional view along cutting line B-B' in FIG. 4, depicting the structure of the silicon carbide semiconductor device according to the embodiment. FIG. 3 is a cross-sectional view along cutting line C-C' in FIG. 4, depicting the structure of the silicon carbide semiconductor device according to the embodiment.

The silicon carbide semiconductor device according to the embodiment is a trench-type MOSFET 50 that includes MOS gates of a trench gate structure at a front surface (surface facing a p-type silicon carbide epitaxial layer 3 described hereinafter) of a semiconductor substrate. A silicon carbide semiconductor base is formed by sequentially forming an n-type silicon carbide epitaxial layer (first semiconductor layer of a first conductivity type) 2 and a p-type silicon carbide epitaxial layer (the second semiconductor layer of a second conductivity type) 3 by epitaxial growth on an $n^+$-type silicon carbide substrate (semiconductor substrate of the first conductivity type) 1 containing silicon carbide. N-type high-concentration regions 6 may be formed by epitaxial growth on the n-type silicon carbide epitaxial layer 2.

The MOS gates of the trench gate structure are configured by the p-type silicon carbide epitaxial layer 3, $n^+$-type source regions (first semiconductor regions of the first conductivity type) 7, $p^{++}$-type contact regions (second semiconductor regions of the second conductivity type) 8, trenches 18, a gate insulating film 9, and gate electrodes 10.

In particular, the trenches 18 are provided to penetrate through the p-type silicon carbide epitaxial layer 3 in a depth direction z from the front surface of the semiconductor substrate and reach the n-type high-concentration regions 6 (when the n-type high-concentration regions 6 are not provided, the n-type silicon carbide epitaxial layer 2, indicated simply as "(2)" hereinafter). The depth direction z is a direction from the front surface of the semiconductor substrate toward a back surface. The trenches 18, for example, are disposed in a striped pattern, each of the trenches 18 having a shape of a stripe.

In the trenches 18, the gate insulating film 9 is provided along inner walls of each of the trenches 18 and the gate electrodes 10 are provided on the gate insulating film 9 so as to be embedded in the trenches 18, respectively. One unit cell of a main semiconductor element is configured by the gate electrode 10 in one of the trenches 18 and mesa regions (region between adjacent trenches 18) adjacent to and sandwiching the gate electrode 10. In FIGS. 1 and 2, while only two trenches of the MOS structure are depicted, numerous MOS gate (insulated gate formed by a metal, an oxide film, and a semiconductor) structures having a trench structure may be further disposed in parallel.

In a surface layer of the n-type silicon carbide epitaxial layer 2, on a source side (side facing source electrodes 13 described hereinafter) of the n-type silicon carbide epitaxial layer 2, an n-type region (hereinafter, the n-type high-concentration region) 6 may be provided so as to be in contact with the p-type silicon carbide epitaxial layer 3. The n-type high-concentration regions 6 are a so-called current spreading layer (CSL) that reduced carrier spreading resistance. The n-type high-concentration regions 6, for example, are provided uniformly along a direction parallel to a substrate front surface (the front surface of the semiconductor substrate) and form inner walls of the trenches 18.

The n-type high-concentration regions 6, from interfaces with the p-type silicon carbide epitaxial layer 3, reach deep positions closer to a drain (back electrode 14 described hereinafter) than are bottoms of the trenches 18. In the n-type high-concentration regions 6, first and second $p^+$-type base regions 4, 5 may each be selectively provided. Each of the first $p^+$-type base regions 4 is provided between adjacent trenches 18 (mesa region), separate from the second $p^+$-type base regions 5 and the trenches 18 and in contact with the p-type silicon carbide epitaxial layer 3. Each of the second $p^+$-type base regions 5 underlies at least the bottom of one of the trenches 18, among the bottom and bottom corner parts of said trench 18. The bottom corner parts of the trenches 18 are borders between the bottom and the sidewalls of the trenches 18.

Pn junctions between the first and the second $p^+$-type base regions 4, 5 and the n-type silicon carbide epitaxial layer 2 are formed at deep positions closer to the drain than are the bottoms of the trenches 18. The first and the second $p^+$-type base regions 4, 5 may be provided in the n-type silicon carbide epitaxial layer 2 without providing the n-type high-concentration regions 6. A depth position of respective ends of the first and the second $p^+$-type base regions 4, 5 closest to the drain suffice to be such that the pn junctions between the first and the second $p^+$-type base regions 4, 5 and the n-type silicon carbide epitaxial layer 2 are at deep positions closer to the drain than are the bottoms of the trenches 18, and may be various changed according to design conditions. An application of high electric field to the gate insulating film 9 at parts thereof along the bottoms of the trenches 18 may be prevented by the first and the second $p^+$-type base regions 4, 5.

In the p-type silicon carbide epitaxial layer 3, the $n^+$-type source regions 7 are selectively provided. The $p^{++}$-type contact regions 8 are selectively provided so as to be in contact with the $n^+$-type source regions 7. The $n^+$-type source regions 7 are in contact with the gate insulating film 9 at the sidewalls of the trenches 18 and face the gate electrodes 10 across the gate insulating film 9 at the sidewalls of the trenches 18.

FIG. 4 is a plan view of the structure of the silicon carbide semiconductor device according to the embodiment. FIG. 4 depicts a plan view of a part along cutting line D-D' in FIGS. 1 to 3, as viewed from a lower side (the back electrode 14). As depicted in FIG. 4, the $n^+$-type source regions 7 include structures (connecting parts S of the $n^+$-type source regions 7) connecting the $n^+$-type source regions 7 in contact with adjacent trenches 18 of the trenches 18, and structures (non-connecting parts T of the $n^+$-type source regions 7) in which the $p^{++}$-type contact regions 8 are provided between the $n^+$-type source regions 7 in contact with the adjacent trenches 18, periodically disposed along a direction (x axis in the drawing) in which the trenches 18 extend in the striped pattern.

In each of the non-connecting parts T between the connecting parts S, multiple regions for which IV characteristics during operation differ are disposed along the direction in which the trenches extend in the striped pattern. In particular, in each of the non-connecting parts T that are between the connecting parts S, multiple regions having differing resistance values are disposed in descending order or ascending order of resistance value, along the direction in which the trenches extend in the stripped pattern. For example, each of the $n^+$-type source regions 7 is formed in a shape that is a stepped-shape in which a width of the trench 18 along a direction orthogonal to the direction along which the trench 18 extends in the striped pattern changes stepwise and a width of each of the $p^{++}$-type contact regions 8 increases, whereby three types of regions including high-resistance regions 31, intermediate-resistance regions 32, and low-resistance regions 33 are disposed in this order (descending order of resistance value in the positive direction along the x axis). The high-resistance regions 31 are regions in which the width of the $p^{++}$-type contact region 8 is narrowest and the resistance is highest. The intermediate-resistance regions 32 are regions in which the width of the $p^{++}$-type contact region 8 is wider than the width of the $p^{++}$-type contact regions 8 of the high-resistance regions 31 and the resistance is lower than the resistance of the high-resistance regions 31. The low-resistance regions 33 are regions in which the width of the $p^{++}$-type contact region 8 is wider than the width of the $p^{++}$-type contact regions 8 of the intermediate-resistance regions 32 and the resistance is lower than the resistance of the intermediate-resistance regions 32, the low-resistance regions 33 have the lowest resistance.

FIG. 1 is a cross-sectional view of a part of one of the low-resistance regions 33; FIG. 2 is a cross-sectional view of one of the connecting parts S of the $n^+$-type source regions 7; and FIG. 3 is a cross-sectional view of a part of one of the high-resistance regions 31. A cross-section of the intermediate-resistance regions 32 differs from the cross-section depicted in FIG. 3 only in that the width of the $p^{++}$-type contact regions 8 differs and therefore, is not depicted in the drawings.

As depicted in FIGS. 1 and 4, in the low-resistance regions 33, tops of the n$^+$-type source regions 7 are covered by an interlayer insulating film 11 and are not in contact with the source electrodes 13. In other words, the interlayer insulating film 11 covers top surfaces of the n$^+$-type source regions 7, and the n$^+$-type source regions 7 are not in contact with the source electrodes 13. Therefore, current that flows in an ON state passes through parts (the connecting parts S, the high-resistance regions 31, the intermediate-resistance regions 32) where the interlayer insulating film 11 is not covering a top surface thereof and flows to the source electrodes 13. In the intermediate-resistance regions 32, the high-resistance regions 31, and the connecting parts S, the n$^+$-type source regions 7 are in contact with the source electrodes 13. Further, from the intermediate-resistance regions 32 to the high-resistance regions 31 and the connecting parts S, the proportion of the contact area between the n$^+$-type source regions 7 and the source electrodes 13 progressively increases.

In the silicon carbide semiconductor device, as cell pitch decreases, the ratio of electric current from the source electrodes 13 increases, resistance between the source and the drain decreases, and the saturated current when the gate voltage is constant increases by a corresponding amount. In the embodiment, multiple regions having differing resistance values are disposed in the non-connecting parts T of the n$^+$-type source regions 7. In FIG. 4, three types of regions including the high-resistance regions 31, the intermediate-resistance regions 32, and the low-resistance regions 33 are disposed. As a result, during rated-voltage operation, the current flows in the low-resistance regions 33 having the lowest resistance, enabling low RonA to be sustained.

On the other hand, when large current flows, the current also flows in the intermediate-resistance regions 32 and when larger current flows, the current further flows in the high-resistance regions 31. In this manner, when large current flows, the current flows in regions having high resistance and therefore, the resistance of the entire silicon carbide semiconductor device increases, enabling saturated current to be reduced to a greater extent than in a conventional structure configured only by the low-resistance regions 33. As a result, the period of time that the silicon carbide semiconductor device is not destroyed during short-circuit may be increased.

Further, in the high-resistance regions 31, the intermediate-resistance regions 32, and the low-resistance regions 33, the length of the trenches 18 along the x axis in the drawing, the resistance values, etc. may be optimally designed according to required characteristics. In FIG. 4, while three types of regions having differing resistance values are disposed, more than three types of regions of differing resistance values may be disposed. Other than the configuration in which three types of regions having differing resistance values are periodically disposed as depicted in FIG. 4, configuration may be such that the three types of regions having differing resistance values are disposed symmetrically with one of the connecting parts at the center. For example, configuration may be such that one of the high-resistance regions 31, one of the intermediate-resistance regions 32, one of the low-resistance regions 33, one of the connecting parts S, another one of the low-resistance regions 33, another one of the intermediate-resistance regions 32, and another one of the high-resistance regions 31 are sequentially arranged. In this case, current concentrates in the connecting part S surrounded by the low-resistance regions 33 and therefore, periodic disposal such as that depicted in FIG. 4 is advantageous. Further, configuration may be such that one of the connecting parts S, one of the high-resistance regions 31, one of the intermediate-resistance regions 32, one of the low-resistance regions 33, another one of the intermediate-resistance regions 32, another one of the high-resistance regions 31, and another one of the connecting parts S are periodically disposed.

Further, the shape of each of the n$^+$-type source regions 7 is a stepped-shape such as that depicted in FIG. 4 and as a result, when the n$^+$-type source regions 7 are formed, even when mask shifting occurs, the high-resistance regions 31, the intermediate-resistance regions 32, and the low-resistance regions 33 are formed between the connecting parts S. Therefore, with respect to mask shifting, low RonA is sustained during rated-voltage operation, and the characteristic of saturated current being reduced in the case of a large current does not easily change.

Figure 5:
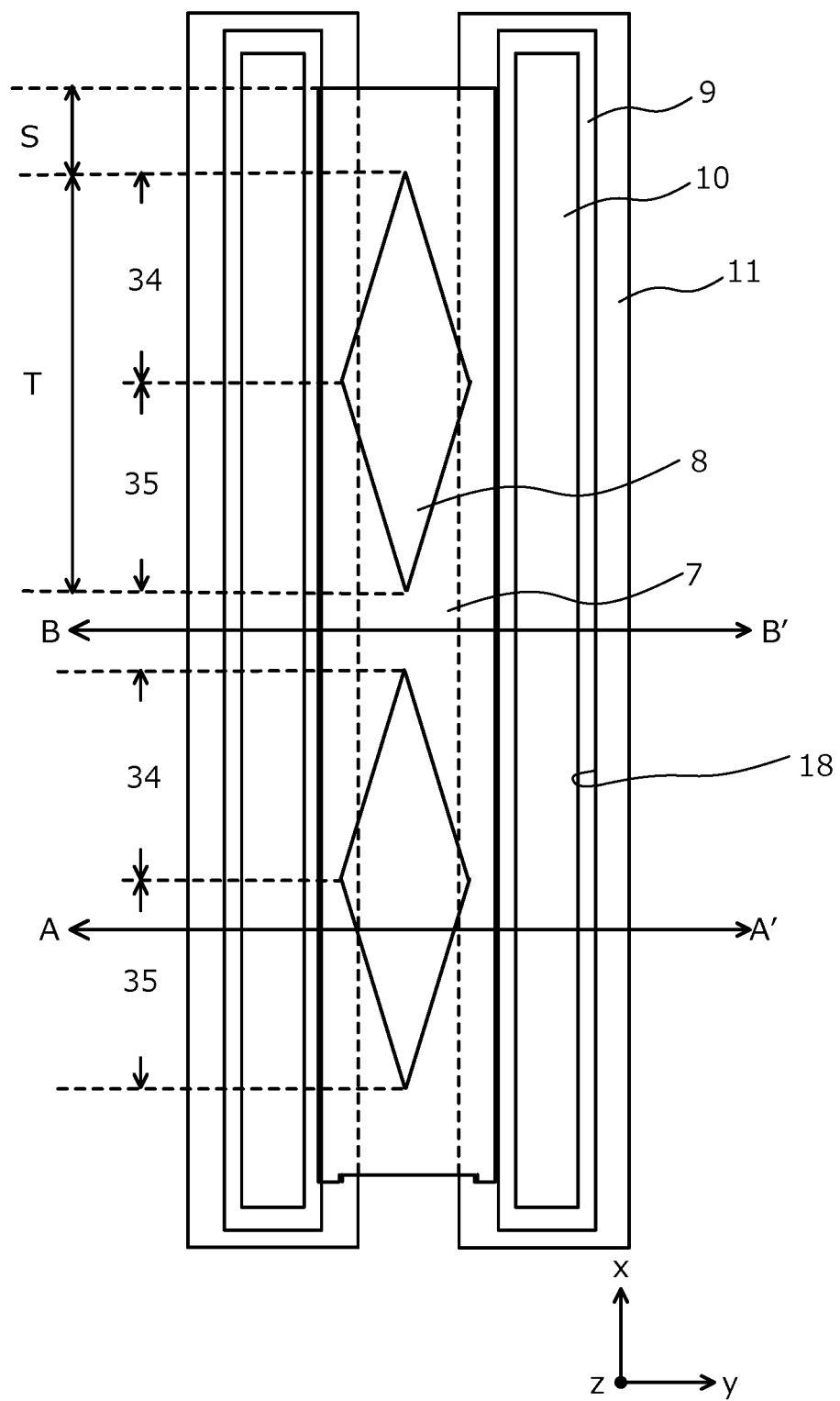
FIG. 5 is a plan view of another structure of the silicon carbide semiconductor device according to the embodiment.

FIG. 5 is a plan view of another structure of the silicon carbide semiconductor device according to the embodiment. As depicted in FIG. 5, in the non-connecting parts T, regions having differing resistances may be disposed continuously. For example, as depicted in FIG. 5, the p$^{++}$-type contact region 8 may be provided in diamond-shape having a diagonal at a midpoint between two adjacent connecting parts S. Each region 34 in FIG. 5 is a region in which the resistance value increases in the positive direction along the x axis and each region 35 in FIG. 5 is a region in which the resistance value decreases in the positive direction along the x axis. As a result, midway between the connecting parts S, the resistance is lowest and with increasing proximity to the connecting parts S, the resistance increases, being highest at a part in contact with the connecting parts S. Even with this shape, during rated-voltage operation, current flows in regions of low resistance and when large current flows, the current flows in regions of high resistance, thereby enabling saturated current to be reduced, similarly to the case depicted in FIG. 4.

In FIG. 5, while the p$^{++}$-type contact regions 8 have a diamond-shape, provided that regions of differing resistances are disposed continuously, the shape is not limited hereto. For example, the p$^{++}$-type contact regions 8 may each have a triangular shape in which one side is in contact with one of the connecting parts S while a vertex opposite to the one side is in contact with another one of the connecting parts S.

Figure 14:
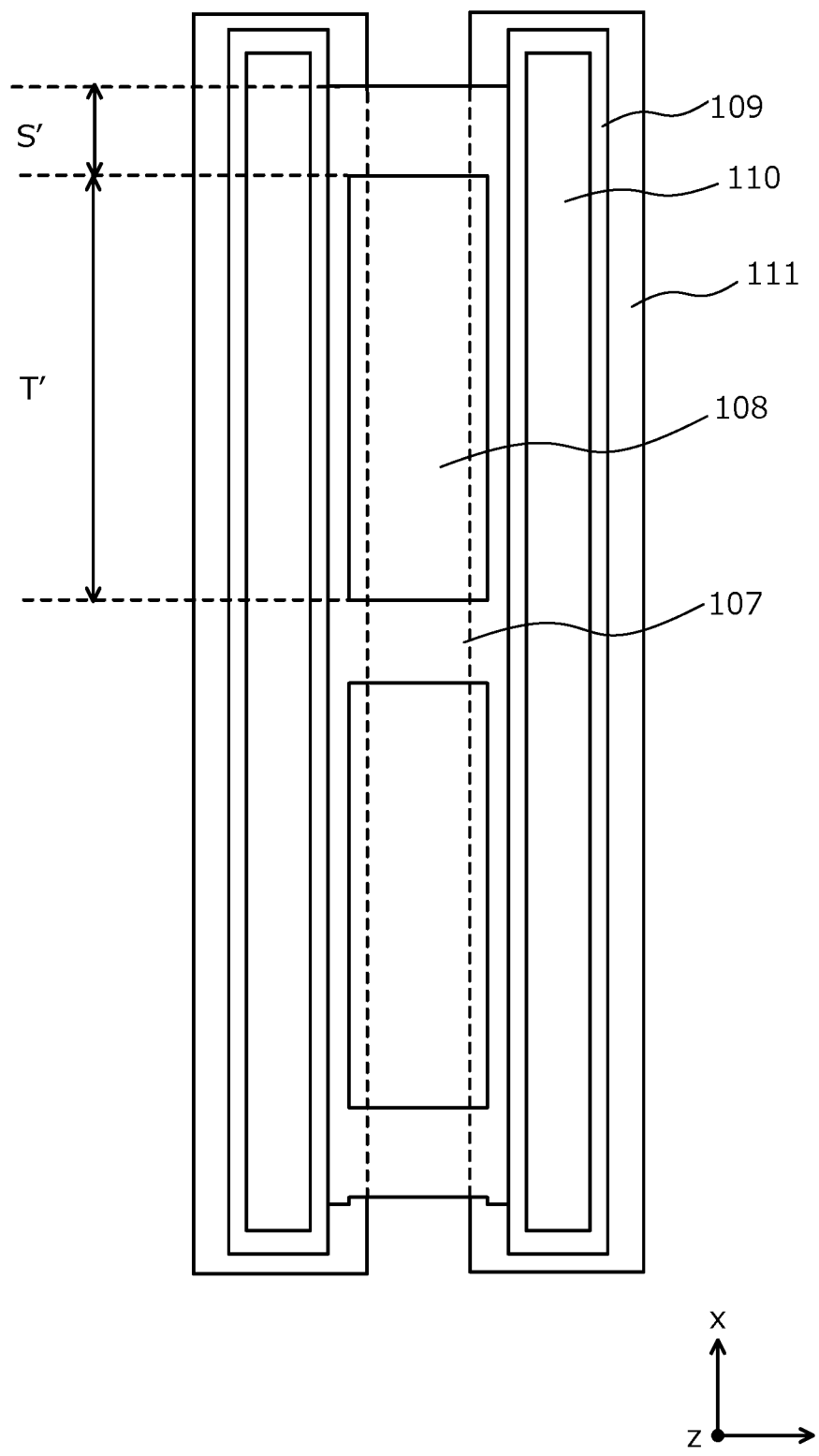
FIG. 14 is a plan view of the structure of the conventional silicon carbide semiconductor device.

Further, in FIGS. 4 and 5, while regions having differing resistances values due to the shapes of the n$^+$-type source regions 7 and the p$^{++}$-type contact regions 8 are disposed in descending order or ascending order of resistance value, formation may be by another method. For example, the regions of differing resistance values may be formed by varying the impurity concentration of the n$^+$-type source region 7. In this case, the planar shape is similar to that of the conventional silicon carbide semiconductor device (FIG. 14). In the n$^+$-type source region 7 sandwiched between the connecting parts S, the regions of differing resistance values may be disposed in descending order of resistance value by gradually reducing the impurity concentration. Further, the regions having differing resistance values may be disposed in descending order of resistance value to a midpoint between the connecting parts S by gradually reducing the impurity concentration of the n$^+$-type source region 7 as the distance from the connecting parts S increases.

Further, the regions having differing resistance values may be formed by varying the depth of the n$^+$-type source region 7. In this case as well, the planar shape is similar to that of the conventional silicon carbide semiconductor device (FIG. 14). Furthermore, the regions having differing resistance values may be formed by changing the type of the impurity contained in the $n^+$-type source region 7. For example, as the impurity, nitrogen (N) may be used in one part of the $n^+$-type source region 7 and arsenic (As) may be used in another part. Further, the regions having differing resistance values may be formed by changing the type of impurity and/or varying the depth and/or the impurity concentration of the $p^{++}$-type contact regions 8.

The interlayer insulating film 11 is provided at an entire area of the front surface of the semiconductor substrate so as to cover the gate electrodes 10. In the interlayer insulating film 11, contact holes 40 that penetrate the interlayer insulating film 11 in the depth direction z and reach the substrate front surface are provided.

The source electrodes (first electrodes) 13, in the contact holes 40, are in ohmic contact with the semiconductor substrate (the $n^+$-type source regions 7) and are electrically insulated from the gate electrodes 10 by the interlayer insulating film 11. On the source electrodes 13, a source electrode pad 15 is provided. The source electrode pad 15 is a multilayer film in which a first TiN film 25, a first Ti film 26, a second TiN film 27, a second Ti film 28, and an Al alloy film 29 are stacked. The source electrodes 13 are in ohmic contact with the $p^{++}$-type contact regions 8.

On the source electrodes 13, first ends of external electrode pins 19 are bonded via a plating film 16 and solder 17. Second ends of the external electrode pins 19 are bonded to a metal bar (not depicted) disposed so as to face the front surface of the semiconductor substrate. Further, the second ends of the external electrode pins 19 are exposed outside a case (not depicted) in which the semiconductor chip is mounted and are electrically connected to an external device (not depicted). A part of the surface of the source electrode pad 15 other than that having the plating film 16 is covered by a first protective film 21. In particular, the first protective film 21 is provided so as to cover the source electrode pad 15 and the plating film 16 is provided in openings of the first protective film 21. The external electrode pins 19 are bonded to the surface of the plating film 16 by the solder 17. To limit the area of the solder 17, a second protective film 23 may be provided on the surface of the plating film 16. The first and the second protective films 21, 23, for example, are each a polyimide film.

On the back surface of the semiconductor substrate, the back electrode (second electrode) 14 that forms a drain electrode is provided. On the back electrode 14, a drain electrode pad (not depicted) is provided.

A method of manufacturing the silicon carbide semiconductor device according to the embodiment will be described. FIGS. 6, 7, 8, 9, 10, and 11 are cross-sectional views of the silicon carbide semiconductor device according to the embodiment during manufacture.

Figure 6:
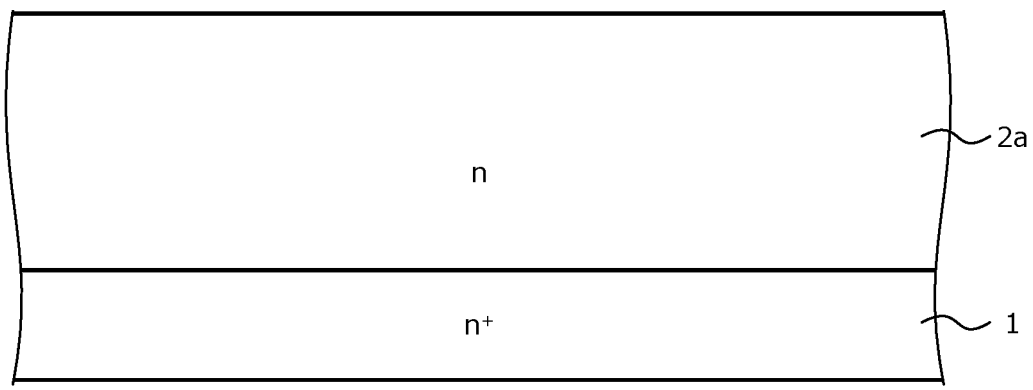
FIG. 6 is a cross-sectional view of the silicon carbide semiconductor device according to the embodiment during manufacture.

First, the $n^+$-type silicon carbide substrate 1 containing an n-type silicon carbide is prepared. Then, on a first main surface of the $n^+$-type silicon carbide substrate 1, a first n-type silicon carbide epitaxial layer 2a containing silicon carbide is formed by epitaxial growth while an n-type impurity, for example, nitrogen atoms (N) are doped, the first n-type silicon carbide epitaxial layer 2a being formed to have a thickness of, for example, about 30 μm. The state up to here is depicted in FIG. 6.

Next, on the surface of the first n-type silicon carbide epitaxial layer 2a, an ion implantation mask having predetermined openings is formed by a photolithographic technique using, for example, an oxide film. Then, a p-type impurity such as aluminum is implanted in the openings of the oxide film, thereby forming lower first $p^+$-type base regions 4a and the second $p^+$-type base regions 5 at a depth of about 0.5 μm.

Further, formation is such that a distance between each of the lower first $p^+$-type base regions 4a and one of the second $p^+$-type base region 5 adjacent thereto is about 1.5 μm. The impurity concentration of the lower first $p^+$-type base regions 4a and the second $p^+$-type base regions 5 is set to be about, for example, $5 \times 10^{18}/cm^3$.

Figure 7:
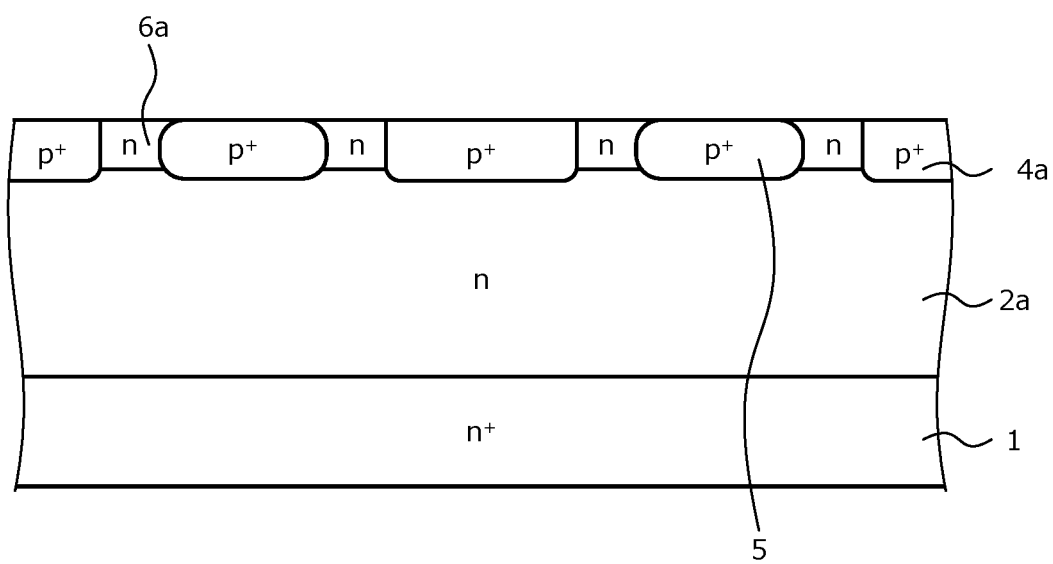
FIG. 7 is a cross-sectional view of the silicon carbide semiconductor device according to the embodiment during manufacture.

Next, lower n-type high-concentration regions 6a may be formed in surface regions of the first n-type silicon carbide epitaxial layer 2a, for example, at a depth of about 0.5 μm by partially removing the ion implantation mask and ion-implanting an n-type impurity such as nitrogen in the openings. The impurity concentration of the lower n-type high-concentration regions 6a, for example, is set to be about $1 \times 10^{17}/cm^3$. The state up to here is depicted in FIG. 7.

Next, on the surface of the first n-type silicon carbide epitaxial layer 2a, a second n-type silicon carbide epitaxial layer 2b doped with an n-type impurity such as nitrogen is formed to have a thickness of about 0.5 μm. The impurity concentration of the second n-type silicon carbide epitaxial layer 2b is set to become about $3 \times 10^{15}/cm^3$. Hereinafter, the first n-type silicon carbide epitaxial layer 2a and the second n-type silicon carbide epitaxial layer 2b are collectively the n-type silicon carbide epitaxial layer 2.

Next, on the surface of the second n-type silicon carbide epitaxial layer 2b, an ion implantation mask having predetermined openings is formed by photolithography using, for example, an oxide film. Then, a p-type impurity such as aluminum is implanted in the openings of the oxide film, whereby upper first $p^+$-type base regions 4b are formed at a depth of about 0.5 μm so as to overlap the lower first $p^+$-type base regions 4a, respectively. The lower first $p^+$-type base regions 4a and the upper first $p^+$-type base regions 4b respectively form connected regions that are the first $p^+$-type base regions 4. The impurity concentration of the upper first $p^+$-type base regions 4b is set to become, for example, about $5 \times 10^{18}/cm^3$.

Figure 8:
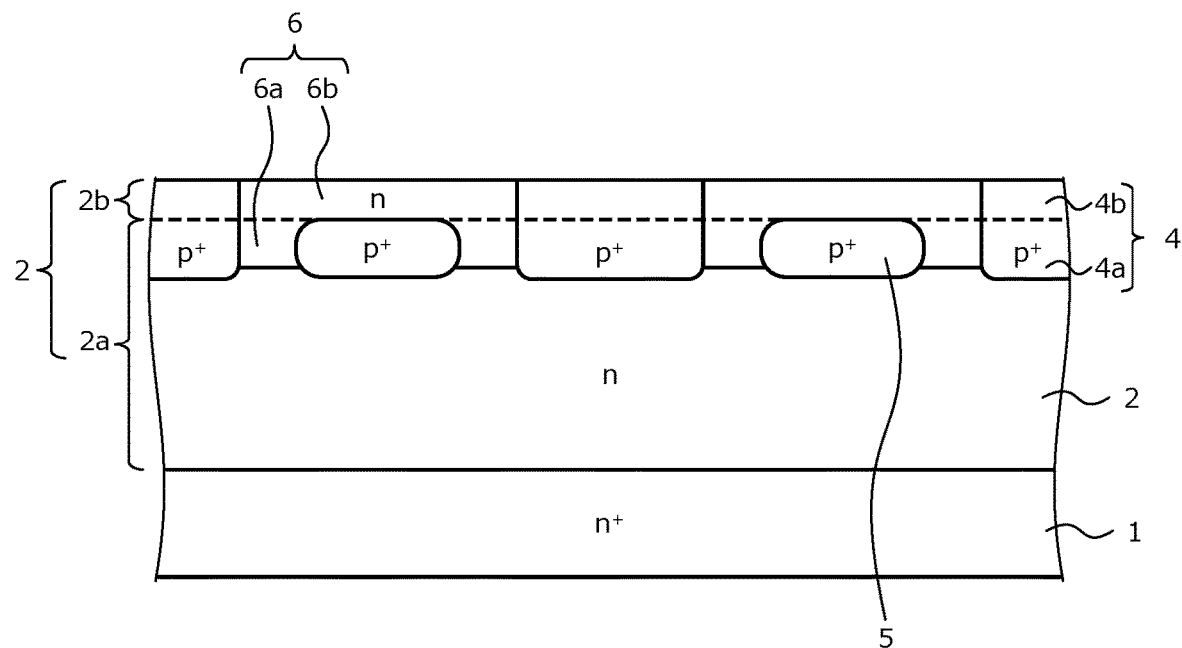
FIG. 8 is a cross-sectional view of the silicon carbide semiconductor device according to the embodiment during manufacture.

Next, upper n-type high-concentration regions 6b may be formed at a depth of, for example, about 0.5 μm in surface regions of the second n-type silicon carbide epitaxial layer 2b by partially removing the ion implantation mask and ion-implanting an n-type impurity such as nitrogen in the openings. The impurity concentration of the upper n-type high-concentration regions 6b, for example, is set to be about $1 \times 10^{17}/cm^3$. The upper n-type high-concentration regions 6b are formed to at least contact a portion of the lower n-type high-concentration regions 6a to form the n-type high-concentration regions 6. However, the n-type high-concentration regions 6 may be formed in an entire substrate area or may be omitted. The state up to here is depicted in FIG. 8.

Next, on the surface of the n-type silicon carbide epitaxial layer 2, the p-type silicon carbide epitaxial layer 3 is formed to have a thickness of about 1.1 μm by epitaxial growth. The impurity concentration of the p-type silicon carbide epitaxial layer 3 is set to be about $4 \times 10^{17}/cm^3$. After the p-type silicon carbide epitaxial layer 3 is formed by epitaxial growth, in the p-type silicon carbide epitaxial layer 3, a p-type impurity such as aluminum may be further ion-implanted in a channel region of the p-type silicon carbide epitaxial layer 3.

Figure 9:
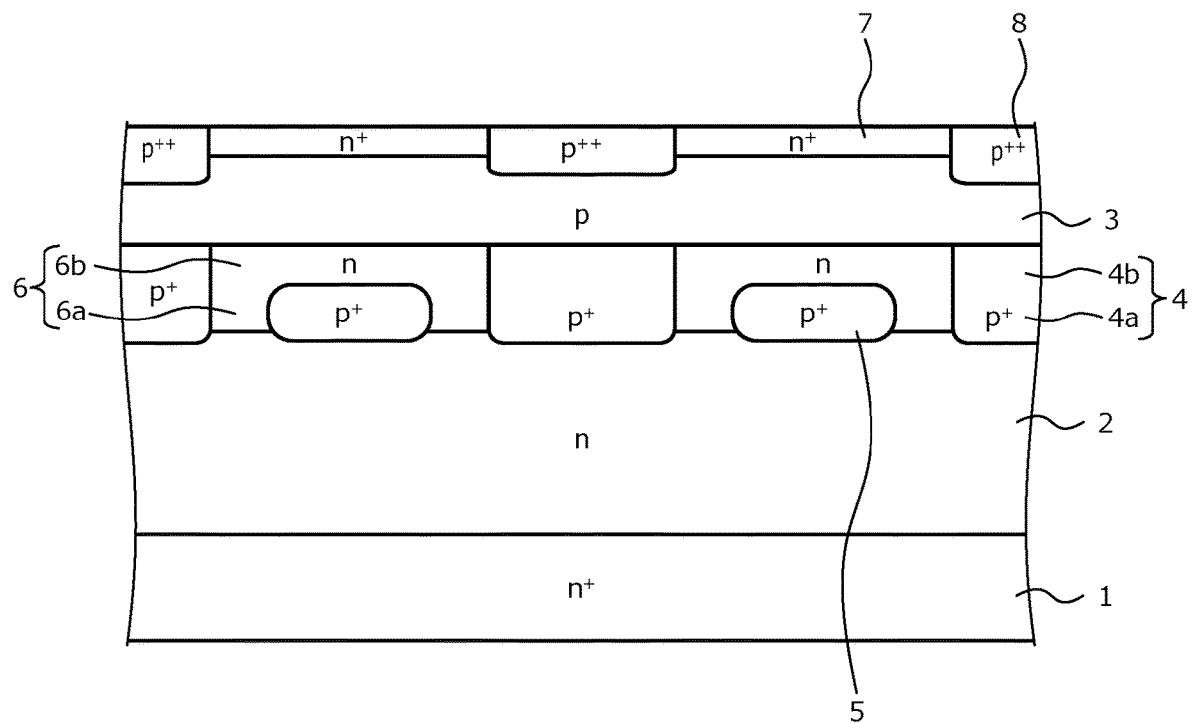
FIG. 9 is a cross-sectional view of the silicon carbide semiconductor device according to the embodiment during manufacture.

Next, on the surface of the p-type silicon carbide epitaxial layer 3, an ion implantation mask having predetermined openings is formed by photolithography using, for example, an oxide film. The ion implantation mask is formed so that the n$^+$-type source regions 7 are formed having the shape depicted in FIG. 4 or the shape depicted in FIG. 5. In the openings, an n-type impurity such as nitrogen (N) or phosphorus (P) is ion-implanted, thereby forming the n$^+$-type source regions 7 at parts of the surface of the p-type silicon carbide epitaxial layer 3. Next, the ion implantation mask used in forming the n$^+$-type source regions 7 is removed; an ion implantation mask having predetermined openings is formed by a similar method; and a p-type impurity such as phosphorus is ion-implanted at parts of the surface of the p-type silicon carbide epitaxial layer 3, thereby forming the p$^{++}$-type contact regions 8. The ion implantation mask is formed so that the p$^{++}$-type contact regions 8 are formed having the shape depicted in FIG. 4 or the shape depicted in FIG. 5. The impurity concentration of the p$^{++}$-type contact regions 8 is set to be higher than the impurity concentration of the p-type silicon carbide epitaxial layer 3. The state up to here is depicted in FIG. 9. Hereinafter, a cross-sectional view of only the structure between the p$^{++}$-type contact regions 8 and the n$^+$-type source regions 7 in FIG. 1 will be depicted.

Next, a heat treatment (annealing) is performed in an inert gas atmosphere at a temperature of about 1700 degrees C., thereby implementing an activation process for the first p$^+$-type base regions 4, the second p$^+$-type base regions 5, the n$^+$-type source regions 7, and the p$^{++}$-type contact regions 8. As described above, ion implanted regions may be activated collectively by a single session of the heat treatment or may be activated by performing the heat treatment each time ion implantation is performed.

Figure 10:
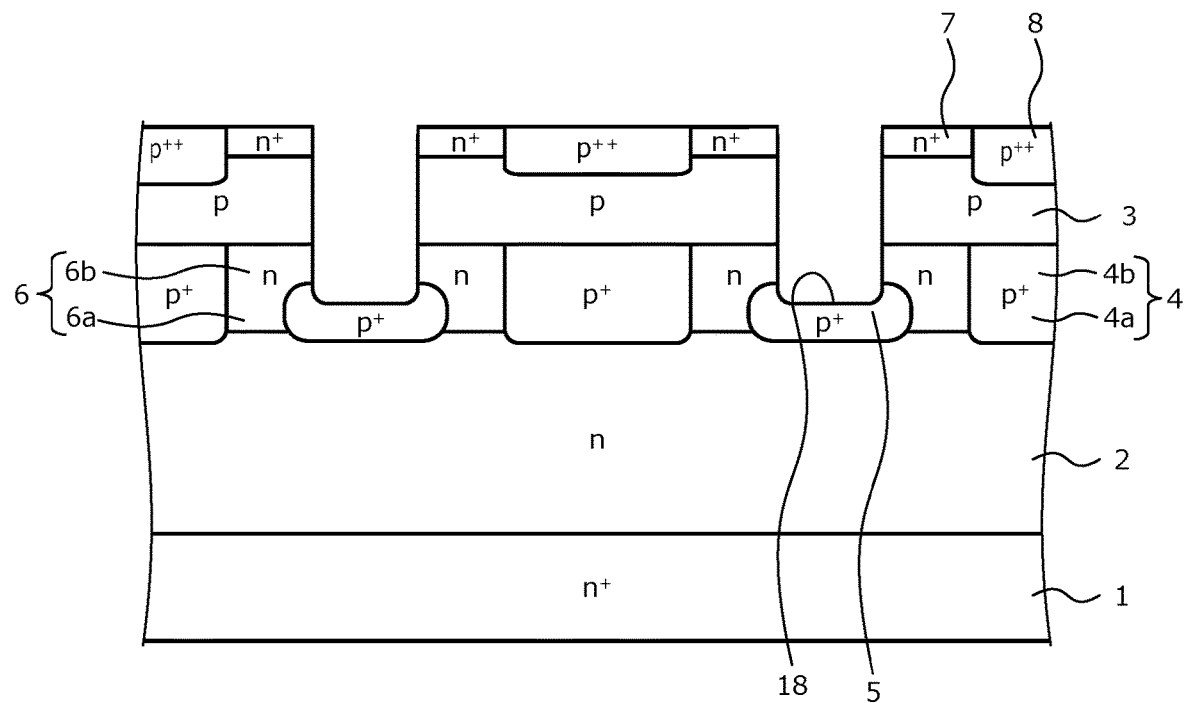
FIG. 10 is a cross-sectional view of the silicon carbide semiconductor device according to the embodiment during manufacture.

Next, on the surface of the p-type silicon carbide epitaxial layer 3, a trench formation mask having predetermined openings is formed by photolithography using, for example, an oxide film. Next, by dry etching, the trenches 18 are formed to penetrate the p-type silicon carbide epitaxial layer 3 and reach the n-type high-concentration regions 6 (2). The bottoms of the trenches 18 may reach the second p$^+$-type base regions 5 formed in the n-type high-concentration regions 6 (2). Next, the trench formation mask is removed. The state up to here is depicted in FIG. 10.

Next, the gate insulating film 9 is formed along the surface of each of the n$^+$-type source regions 7 and the sidewalls and the bottom of each of the trenches 18. The gate insulating film 9 may be formed by thermal oxidation at a temperature of about 1000 degrees C. in an oxygen atmosphere. Further, the gate insulating film 9 may be formed by a deposition method by chemical reaction such as that for a high temperature oxide (HTO).

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography to be left in the trenches 18 and thereby, form the gate electrodes 10.

Figure 11:
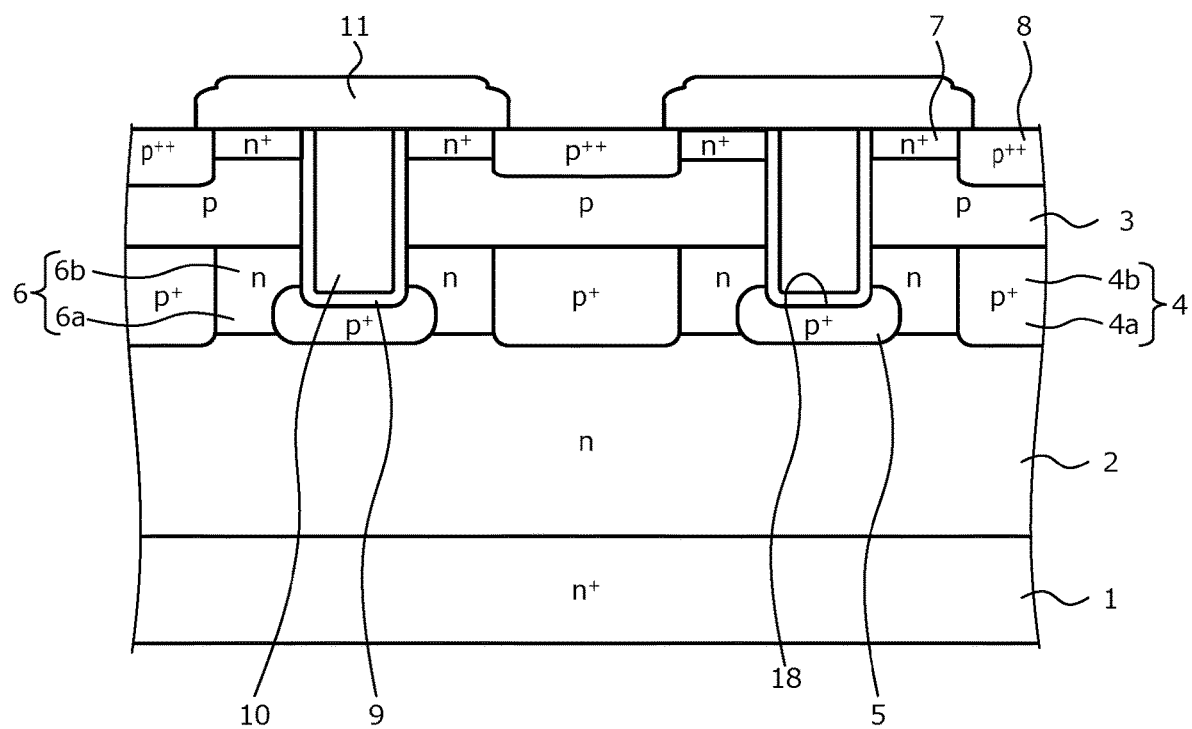
FIG. 11 is a cross-sectional view of the silicon carbide semiconductor device according to the embodiment during manufacture.

Next, for example, a phosphate glass is deposited so as to cover the gate insulating film 9 and the gate electrodes 10, and have a thickness of about 1 μm, thereby forming the interlayer insulating film 11. Next, a barrier metal may be formed by a stacked layer of titanium and titanium nitride, or titanium (Ti), or titanium nitride (TiN) so as to cover the interlayer insulating film 11. The interlayer insulating film 11 and the gate insulating film 9 are patterned by photolithography to form contact holes that expose the n$^+$-type source regions 7 and the p$^{++}$-type contact regions 8. Thereafter, a heat treatment (reflow) is performed to planarize the interlayer insulating film 11. The state up to here is depicted in FIG. 11. Further, after the formation of the contact holes in the interlayer insulating film 11, the barrier metal formed by the stacked layer of titanium and titanium nitride, or titanium (Ti), or titanium nitride (TiN) may be formed. In this case, contact holes exposing the n$^+$-type source regions 7 and the p$^{++}$-type contact regions 8 are further provided in the barrier metal.

Next, a conductive film forming the source electrodes 13 is formed on the interlayer insulating film 11 and in the contact holes provided in the interlayer insulating film 11. The conductive film is, for example, a nickel (Ni) film. Similarly, on a second main surface of the n$^+$-type silicon carbide substrate 1, a nickel (Ni) film is further formed. Thereafter, a heat treatment is performed at a temperature of, for example, about 970 degrees C. to covert the nickel film in the contact holes into a silicide and thereby, form the source electrodes 13. Concurrently, the nickel film formed on the second main surface becomes the back electrode 14 forming an ohmic contact with the n$^+$-type silicon carbide substrate 1. Thereafter, the unreacted nickel film is selectively removed, for example, leaving the source electrodes 13 in the contact holes.

Next, for example, by a sputtering method, the first TiN film 25, the first Ti film 26, the second TiN film 27, and the second Ti film 28 are sequentially stacked so as to cover the interlayer insulating film 11 and the source electrodes 13 on the front surface of the silicon carbide semiconductor base, and the Al alloy film 29 is formed to have a thickness of, for example, about 5 μm. The Al alloy film 29 may be an Al film. The Al alloy film 29, for example, is an Al—Si film or an Al—Si—Cu film. This conductive film is patterned by photolithography to be left in the active region of the entire element and thereby, form the source electrode pad 15.

Next, a polyimide film is formed on the Al alloy film 29 and thereafter, the polyimide film is selectively removed by photolithography and etching to form the first protective film 21 and openings in the first protective film 21. Next, on the Al alloy film 29 exposed in the openings of the first protective film 21, the plating film 16 is formed.

Next, the second protective film 23 is formed so as to cover borders between the plating film 16 and the first protective film 21. The second protective film 23 is, for example, a polyimide film. Thereafter, the external electrode pins 19 are formed on the plating film 16 via the solder 17, thereby completing the semiconductor device depicted in FIGS. 1 to 3.

Figure 12:
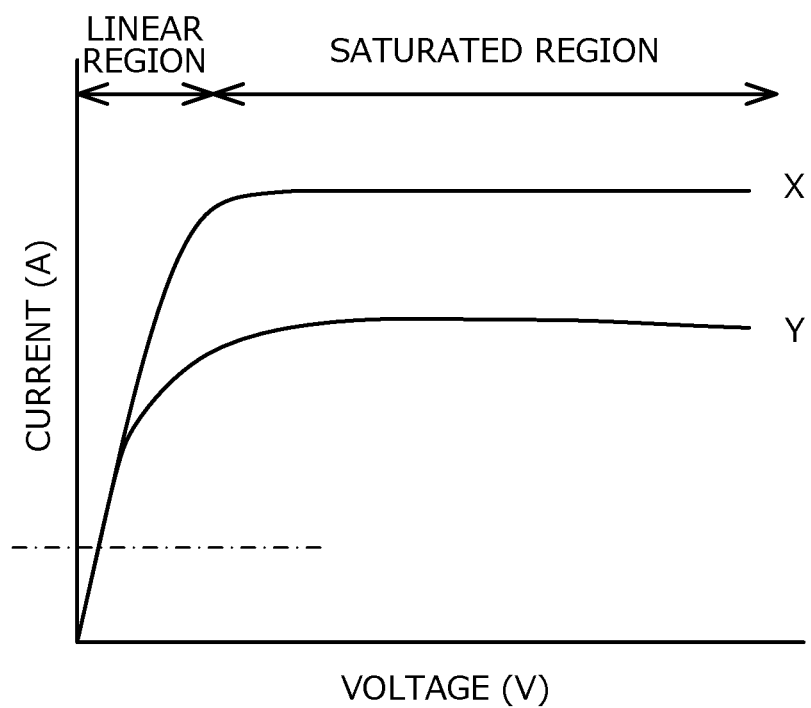
FIG. 12 is a graph depicting V-I characteristics of the silicon carbide semiconductor device according to the embodiment and a conventional silicon carbide semiconductor device.
Figure 13:
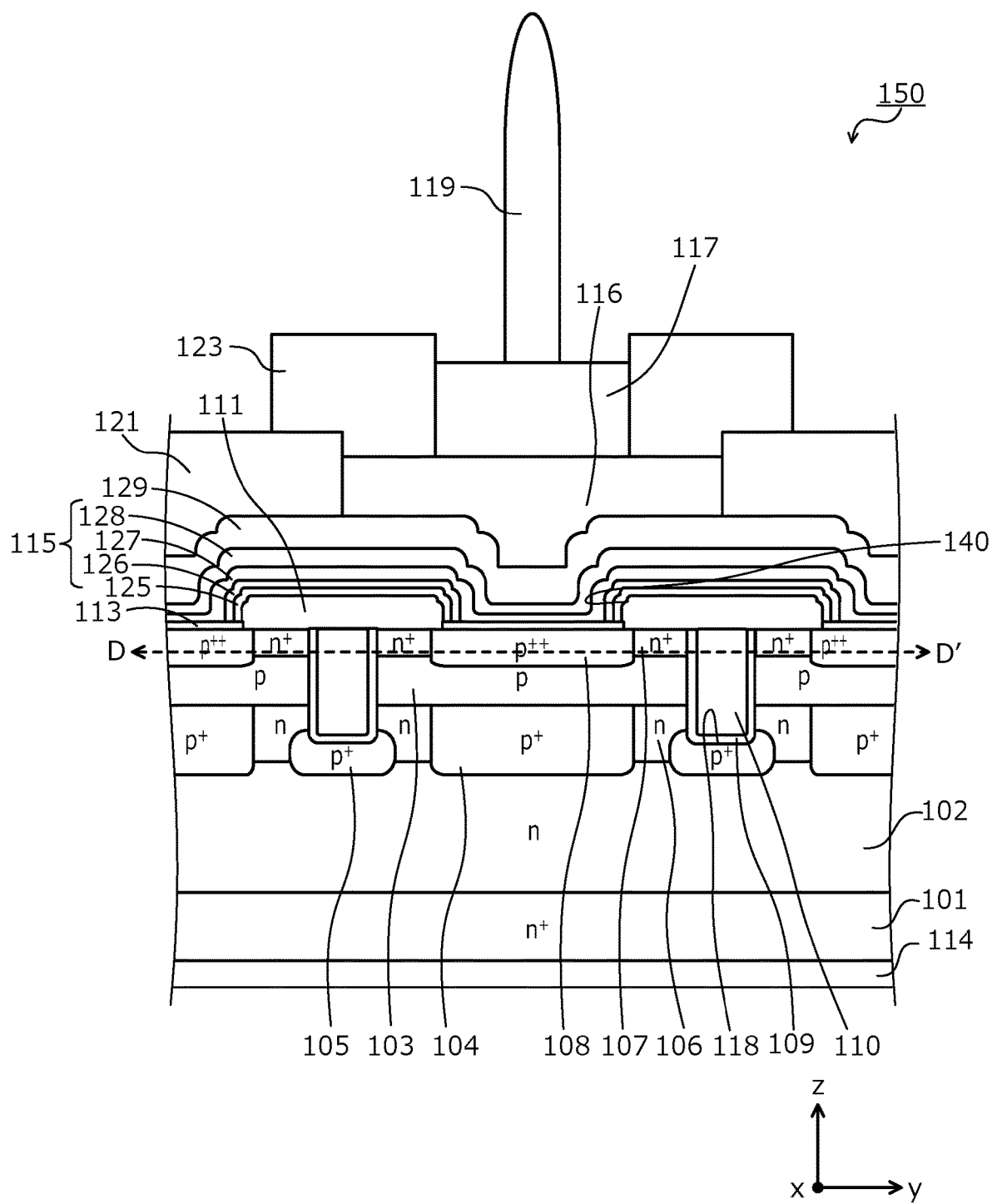
FIG. 13 is a cross-sectional view of a structure of the conventional silicon carbide semiconductor device.

FIG. 12 is a graph depicting V-I characteristics of the silicon carbide semiconductor device according to the embodiment and the conventional silicon carbide semiconductor device. In FIG. 12, a horizontal axis indicates voltage between the drain and the source in units of V. A vertical axis indicates current between the drain and the source in units of A. In FIG. 12, curve X indicates characteristics of the conventional silicon carbide semiconductor device and curve Y indicates characteristics of the silicon carbide semiconductor device according to the embodiment. The conventional silicon carbide semiconductor device, as indicated by curve X in FIG. 15, is a silicon carbide semiconductor device having low RonA and a large saturated current value.

As depicted in FIG. 12, during rated-voltage operation (dotted-dashed line in FIG. 12), characteristics of the silicon carbide semiconductor device according to the embodiment and characteristics of the conventional silicon carbide semiconductor device are similar. Therefore, during rated-voltage operation, the silicon carbide semiconductor device according to the embodiment may pass current about equal to that of the conventional silicon carbide semiconductor device having low RonA. On the other hand, in a region in which the rated current is exceeded, the slope of the V-I characteristics decreases and in a saturated region, the silicon carbide semiconductor device according to the embodiment has lower saturated current and higher short circuit capability than the conventional silicon carbide semiconductor device having low RonA.

As described above, according to the silicon carbide semiconductor device according to the embodiment, in the non-connecting parts, the regions having differing resistance values are disposed in ascending or descending order of resistance value. As a result, during rated-voltage operation, the silicon carbide semiconductor device according to the embodiment passes current through the low-resistance regions that have the lowest resistance and sustains low RonA. On the other hand, when large current flows, the current flows in the regions having high resistance and therefore, the resistance of the entire silicon carbide semiconductor device increases, enabling the saturated current to be reduced. As a result, the period of time that the silicon carbide semiconductor device is not destroyed during short-circuit may be increased.

In the foregoing, the present invention may be variously changed within a range not departing from the spirit of the invention and in the embodiments described above, for example, dimensions, impurity concentrations, etc. of regions may be variously set according to required specifications. Further, in the embodiments described above, while a case in which silicon carbide is used as a wide bandgap semiconductor is described as an example, application to a wide bandgap semiconductor other than silicon carbide, such as, for example, gallium nitride (GaN) is possible. Further, in the embodiments, while the first conductivity type is assumed as an n-type and the second conductivity type is assumed as a p-type, the present invention is similarly implemented when the first conductivity type is a p-type and the second conductivity type is an n-type.

According to the invention described above, in the non-connecting parts (between two adjacent structures), the regions having differing resistance values are disposed in ascending order or descending order of resistance value. As a result, during rated-voltage operation, the silicon carbide semiconductor device passes current through the low-resistance regions that have the lowest resistance and sustains low RonA. On the other hand, when large current flows, the current flows in the regions having high resistance and therefore, the resistance of the entire silicon carbide semiconductor device increases, enabling the saturated current to be reduced. As a result, the period of time that the silicon carbide semiconductor device is not destroyed during short-circuit may be increased.

The semiconductor device according to the present invention achieves an effect in that the semiconductor device reduces energization resistance between the source electrodes and the drain electrode in a case of rated current and enables the short circuit capability to be increased.

As described above, the semiconductor device according to the invention is useful for power semiconductor devices used in power converting equipment such as inverters, power supply devices such as in various industrial machines, and igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
   a semiconductor substrate of a first conductivity type, having a first main surface and a second main surface opposite to each other;
   a first semiconductor layer of the first conductivity type, provided on the first main surface of the semiconductor substrate and having an impurity concentration lower than an impurity concentration of the semiconductor substrate, the first semiconductor layer having a first surface and a second surface opposite to each other, the second surface facing the semiconductor substrate;
   a second semiconductor layer of a second conductivity type, selectively provided on the first surface of the first semiconductor layer, the second semiconductor layer having a first surface and a second surface opposite to each other, the second surface facing the semiconductor substrate;
   a plurality of first semiconductor regions of the first conductivity type, selectively provided in the second semiconductor layer at the first surface thereof;
   a plurality of second semiconductor regions of the second conductivity type, selectively provided in the second semiconductor layer at the first surface thereof, to be in contact with the first semiconductor regions;
   a plurality of trenches provided in a striped pattern that extends in a first direction, penetrating the first semiconductor regions and the second semiconductor layer, and reaching the first semiconductor layer;
   a plurality of gate electrodes respectively provided in the trenches via a gate insulating film;
   a plurality of first electrodes provided on surfaces of the first semiconductor regions and the second semiconductor regions; and
   a second electrode provided on the second main surface of the semiconductor substrate, wherein
   the first semiconductor regions include a plurality of connecting parts and a plurality of non-connecting parts that are alternately arranged in the first direction, each connecting part being continuous in a second direction orthogonal to the first direction, and each non-connecting part being separated into two halves in the second direction by one of the second semiconductor regions, each half including a plurality of regions having different resistance values, disposed in a descending order or an ascending order of the resistance values along the first direction,
   the first electrodes are in contact with the first semiconductor regions through the connecting parts of the first semiconductor regions.

2. The semiconductor device according to claim 1, wherein
   in said each half, the plurality of regions have a plurality of widths in the second direction, the widths changing stepwise along the first direction.

3. The semiconductor device according to claim 1, wherein
   in said each half, the plurality of regions include three regions, which are a high-resistance region, an intermediate-resistance region, and a low-resistance region that are disposed sequentially.

4. The semiconductor device according to claim 1, wherein
   one of the non-connecting parts is separated by one of the second semiconductor regions that is of a diamond-shape, a diagonal of which connects midpoints of the one non-connecting part in a plan view.

5. The semiconductor device according to claim 1, wherein
   the plurality of regions having the different resistance values are periodically disposed along the first direction.

* * * * *